United States Patent [19]

Vermillion

[11] 3,824,588

[45] July 16, 1974

[54] ANALOG TO DIGITAL CONVERTER HAVING DIGITAL OFFSET CORRECTION

[75] Inventor: Ronald G. Vermillion, Rockville, Md.

[73] Assignee: The United States of America as represented by the Secretary of the Navy, Washington, D.C.

[22] Filed: Feb. 9, 1973

[21] Appl. No.: 330,924

[52] U.S. Cl. .. 340/347 CC, 340/347 AD, 324/99 D

[51] Int. Cl. ....................... H03k 13/02, H03k 13/32

[58] Field of Search ................ 340/347 AD, 347 CC

[56] References Cited

UNITED STATES PATENTS

| | | | |
|---|---|---|---|
| 3,445,839 | 5/1969 | Engelberg et al. | 340/347 CC |
| 3,550,114 | 12/1970 | Cole | 340/347 AD |
| 3,550,114 | 12/1970 | Cole | 340/347 AD |

OTHER PUBLICATIONS

IBM Technical Disclosure Bulletin, Kinberg et al., "Calibrated A-D Converter", Vol. 9, No. 11, 4/1967.

*Primary Examiner*—Thomas J. Sloyan
*Attorney, Agent, or Firm*—R. S. Sciascia; J. A. Cooke

[57] ABSTRACT

An analog to digital converter digitizes incoming analog signals and also corrects the digitized value for zero baseline offset. The converter is a ripple counter using an inverted resistor ladder network. The output of the ladder network is compared with the incoming analog signal for equality. When equality is sensed the counter is stopped. Offset correction is performed by digitizing a zero level analog signal, determining the error, and storing the error in a register. The stored value of the error is added or subtracted arithmetically to subsequent conversions.

2 Claims, 1 Drawing Figure

PATENTED JUL 16 1974
3,824,588
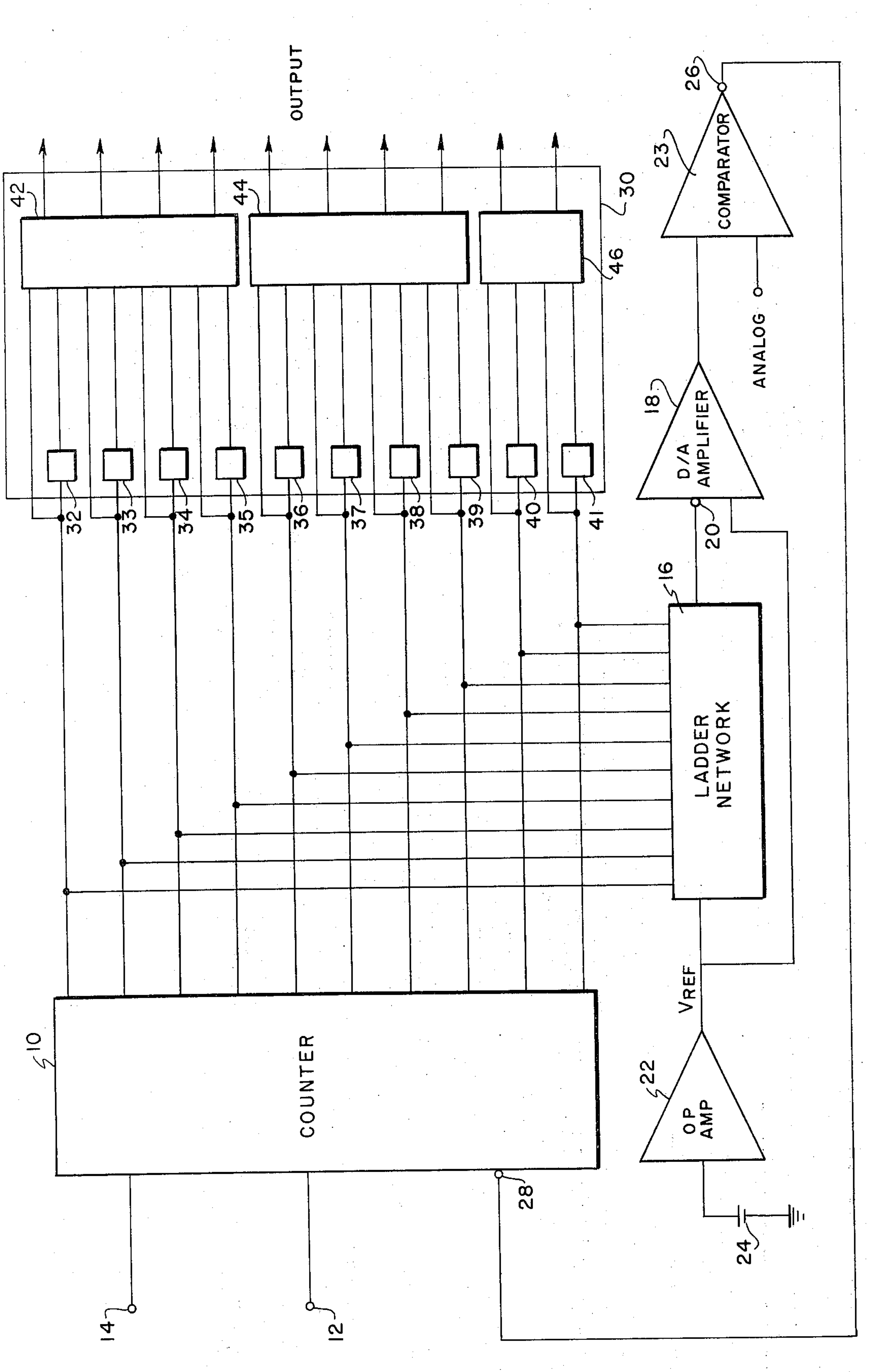

ANALOG TO DIGITAL CONVERTER HAVING DIGITAL OFFSET CORRECTION

BACKGROUND OF THE INVENTION

This invention relates to an analog to digital converter and more specifically to an analog to digital converter for use with in-situ systems which consumes minimum power and is capable of correcting the zero baseline of the converter affected by environmental effects.

Previous analog to digital converters designed for in-situ measurement applications are generally made of discrete or hybrid components, such as the Geodyne Model A-775 Digitizer which is an in-situ data storage system for a submerged body. This converter uses a successive approximation technique for conversion and elaborate compensation techniques are used to reduce environmental effects. However, it has been noted that this type of converter is very difficult to repair under field conditions. The power consumption of this type of converter also limits its ultimate usefulness.

Zero offsets and their variation with time and temperature have long been an annoying problem in A/D converters. They are caused primarily by analog circuits, and occurs in even the most sophisticated designs. In the past, these offsets have been minimized by reducing the individual offsets in amplifiers, comparators, etc. This often resulted, though, in large converters that required many adjustments. More recent automatic offset techniques operate on the following technique: A voltage representing zero analog input voltage is converted into digital form and compared with a digital number representing zero. The resulting error signal is then converted back into a corresponding analog voltage, which is fed back to the converter summing point. If there is any offset in the system, the voltage fed back is non-zero and compensates for the offset. All the methods convert the offset value to an analog voltage.

SUMMARY OF THE INVENTION

In accordance with this invention, a counter-type, inverted resistor ladder analog to digital converter having automatic correction for zero baseline error is employed. The counter outputs steer COS/MOS switches which steer ladder current, either to ground or to the input of an operational amplifier. The op-amp output is compared with the analog voltage in a voltage comparator. When equal comparison is achieved, the voltage comparator output causes the counter to stop, and the digitized output may be read out. For baseline error correction, the analog signal conditioning amplifier inputs are shorted to each other and the resulting error is digitized as above. The error is added to, or subtracted from, the counter digitized output in accordance with the sign of the error, and the true output is thereby produced.

It is therefore an object of the present invention to provide an analog to digital converter having automatic zero offset correction.

Another object of the present invention is to provide an in-situ analog to digital converter having a low power consumption.

Yet another object of the present invention is to provide for an analog to digital converter for use in in-situ data measurement system capable of correcting environmental effects on the zero baseline of the converter.

Still another object of the present invention is an A/D converter utilizing digital zero baseline correction.

A still further object of the present invention is a compact analog to digital converter utilizing cos/mos logic.

These and other objects and advantages of the present invention will become apparent from the following description of the illustrative embodiment of the invention taken in conjunction with the accompanying drawing in which:

The FIGURE illustrates a block diagram of the preferred embodiment of the invention.

DESCRIPTION OF THE PREFERRED EMBODIMENT

Referring now to the drawings, the FIGURE illustrates in block diagram form, the preferred embodiment of the analog to digital converter with automatic zero offset correction on the output of the converter. Counter 10 comprises a binary ripple counter which is reset at the beginning of each cycle by an enabling pulse at terminal 12. A clock signal applied at input terminal 14 of counter 10 advances the counter. The outputs of the ripple counter 10 operate on ladder network 16 comprising a conventional inverted resistor ladder network whose legs are switches between ground and the summing junction 20 of D/A amplifier 18 to be described hereinafter. The resistor ladder legs are switched between ground and the summing junction 20 by COS/MOS switches (not shown) connected in a DPDT configuration controlled by the outputs of counter 10. A true output switches the associated leg to the summing junction 20 and a false output switches the associated leg to ground.

The ladder network 16 is driven by reference voltage $V_{REF}$, which may be 5 volts, obtained from a unity gain operational amplifier 22 whose noninverting input is connected to a battery 24. The current at summing junction 20 of D/A amplifier 18 is the sum of the currents contributed by the individual legs switched to the summing junction which is proportional to the state of the A/D converter 10. D/A amplifier 18 comprises a differentially connected op-amp having a gain of two of the inverting input for the resistor ladder input and a unity gain at the noninverting input for reference voltage input $V_{REF}$. D/A amplifier 18 converts the 0 to 5 volt swing of the resistor ladder 16 to a +5 to −5 volt swing. This signal is then fed to the inverting input of voltage comparator 23 which comprises an open loop operational amplifier. The ANALOG signal is connected to the noninverting input of comparator 23. When the ANALOG signal voltage and the voltage from D/A amplifier 18 are identical, comparator 23 produces an output pulse at terminal 26 coupled to input 28 of counter 10, inhibiting the counter 10 from advancing further. This may be accomplished by numerous ways utilizing logic circuitry such as AND gates and flip flops coupled to the clock input terminal 14. Ripple counter 10 now contains the digitized value of the ANALOG signal input to the voltage comparator 24, and will retain this value until reset by an enabling pulse at terminal 12.

The digital output from counter 10 is also supplied to the offset correction network 30 whose function is to add or subtract an error stored in its registers from the output of the counter. The offset error is determined by digitizing a zero input to the input amplifiers (not shown) and storing the deviation from digital zero in a register. The inputs to the input amplifiers are switched together prior to digitizing every analog signal as described hereinabove. This zero input is digitized through the counter 10 and stored in storage data flip flops 32-41, which are clocked (not shown) only when digitizing zero in correction network 30. Digital zero, for a ten bit ripple counter, is represented as 1000000000, located midscale on the counter. If, for example, the analog zero were digitized as 1000000111, the value 0000000111 would be subtracted from the ensuing digitized analog value to obtain the true digitized value which is then supplied at the output terminals. If the deviation from digital zero is positive, the error is arithmetically subtracted from the A/D counter 10 state. If the deviation from digital zero is negative, the error is arithmetically added to the A/D counter 10 state. The addition, or subtraction takes place in full adders 42, 44, 46, which are 4 bit full adders but it is not necessary that they be. Both arithmetic computations is done by two's complement addition, with the corrected digital word appearing at the output of the full adders 42, 44, 46.

It can therefore be seen that the invention very effectively provides automatic digital zero offset correction which places less stringent requirements on the input amplifiers to the converter. Power consumption is extremely low for this compact. It will be recognized that many modifications and variations of the present invention are possible in light of the above teachings. For example, the zero offset correction can apply to any parallel type A/D converter.

The invention is not limited to the embodiments described above, but all changes and modifications thereof not constituting departures from the spirit and scope of the invention are intended to be covered by the following claims.

What is claimed as new and desired to be secured by Letters Patent of the United States is:

1. An analog to digital converter comprising:

a ripple counter;

a ladder network coupled to the output of said counter;

a voltage comparator coupled to the output of said ladder network for comparing the analog output of said network with the analog signal to be digitized and for producing an inhibiting signal to said counter when said ladder network output and said analog signal are equal, whereby said counter retains said digitized analog signal; and a zero offset correction network coupled to the output of said counter for digitally modifying said digitized analog signal in said network to its correct value; said zero offset correction network comprising:

a plurality of storage devices, one storage device coupled to a respective one of the outputs of said counter, said storage devices being clocked to accept and store a digital signal only when digital zero is measured; and a plurality of full adders to add said stored digital signal to a digitized analog signal.

2. An A/D converter as recited in claim 1 wherein:

said storage devices comprise flip flops and said addition is in two's complement addition.

* * * * *